United States Patent [19]
Nakamura

[11] Patent Number: 5,678,744
[45] Date of Patent: Oct. 21, 1997

[54] METHOD FOR CUTTING A HARD TO CUT WAFER

[75] Inventor: Takao Nakamura, Osaka, Japan

[73] Assignee: Sumitomo Electric Industries, Ltd., Osaka, Japan

[21] Appl. No.: 541,458

[22] Filed: Oct. 10, 1995

Related U.S. Application Data

[63] Continuation of Ser. No. 114,334, Aug. 31, 1993, abandoned.

[30] Foreign Application Priority Data

| Aug. 31, 1992 | [JP] | Japan | 4-255592 |
| Aug. 31, 1992 | [JP] | Japan | 4-255593 |
| Aug. 6, 1993 | [JP] | Japan | 5-215071 |

[51] Int. Cl.$^6$ ............................................. B26F 3/12
[52] U.S. Cl. .................................. 225/2; 225/93.5
[58] Field of Search ................... 225/93.5, 2; 125/30.1

[56] References Cited

U.S. PATENT DOCUMENTS

| 3,453,097 | 7/1969 | Hafner | 65/112 |
| 3,695,497 | 10/1972 | Dear | 225/93.5 |
| 3,756,482 | 9/1973 | De Torre | 225/2 |
| 3,795,502 | 3/1974 | De Torre | 225/2 X |
| 3,795,572 | 3/1974 | De Torre | 225/93.5 X |
| 3,800,991 | 4/1974 | Grove et al. | 225/93.5 X |
| 3,865,673 | 2/1975 | De Torre | 225/93.5 X |
| 4,033,490 | 7/1977 | Ulivi | 225/93.5 X |
| 4,190,184 | 2/1980 | Oelke et al. | 225/93.5 |
| 4,228,937 | 10/1980 | Tocci | 225/96.5 |
| 4,248,369 | 2/1981 | Clausen | 225/2 |
| 4,469,500 | 9/1984 | Miller | 225/2 |
| 4,498,451 | 2/1985 | Beltz et al. | 225/103 |
| 4,995,539 | 2/1991 | Richard | 225/96.5 |
| 5,232,904 | 8/1993 | Wenger et al. | 505/1 |
| 5,308,800 | 5/1994 | Wehrle et al. | 505/400 |

FOREIGN PATENT DOCUMENTS

| 2 121 455 | 11/1972 | Germany. |
| 248 544 | 8/1987 | Germany. |

OTHER PUBLICATIONS

*Patent Abstracts of Japan*, Abstract vol. 016367, Pub. date Aug. 1992, No. 4–116848, Apr. 1992.
*Patent Abstracts of Japan*, Abstract vol. 014450, Pub. date Sep. 1990, No. 2–179708, Jul. 1990.
*Patent Abstracts of Japan*, Abstract vol. 012244, Pub. date Jul. 1988, No. 63–33842, Feb. 1988.
*Patent Abstracts of Japan*, Abstract vol. 001005, Pub. date Mar. 1977, No. 51–118187, Oct. 1976.

*Primary Examiner*—Kenneth E. Peterson
*Attorney, Agent, or Firm*—Foley & Lardner

[57] ABSTRACT

A method for breaking a hard to cut wafer, such as a $SrTiO_3$ single-crystal wafer or amorphous wafer, into sections comprises the steps of scribing the wafer to form a groove along a breaking line, heating the groove for a period of about between 30 seconds to 5 minutes, cooling the wafer to a room temperature, and then breaking the wafer along the breaking line by applying a bending moment about the breaking line. The wafer can have an oxide superconductor film, such as $Y_1Ba_2Cu_3O_{7\delta}$, deposited on its surface before the wafer is cut.

14 Claims, 4 Drawing Sheets

METHOD FOR CUTTING A HARD TO CUT WAFER

This application is a continuation of application Ser. No. 08/114,334, filed Aug. 31, 1993, now abandoned.

BACKGROUND OF THE INVENTION

1. Field of the Invention

The present invention relates to a method for cutting a hard to cut wafer, and more specifically to a method for cutting a hard to cut wafer such as a $SrTiO_3$ single crystal wafer etc.

2. Description of Related Art

Most of crystalline wafers of inorganic materials, such as semiconductor wafers, oxide wafers etc., which are utilized for electric devices are very hard. In order to divide or cut the wafers, a method utilizing cleavage, which is one of crystallographic characteristics, or a method utilizing a diamond tool, such as a diamond cutter or a dicing saw, is generally used. For example, on one silicone wafer, which is utilized for manufacturing integrated circuits, a lot of semiconductor integrated circuits are simultaneously prepared and they are divided into individual integrated circuits by using diamond cutter.

A thin film of an oxide superconductor recently advanced in study is often deposited on an oxide single crystal wafer such as an MgO single crystal wafer or a $SrTiO_3$ single crystal wafer etc. High quality oxide superconductor thin films are rather easily deposited on these oxide single crystal wafers. Of course, devices that utilize oxide superconductor thin films are often prepared on the above oxide wafers.

When an oxide superconductor thin film is deposited on the above oxide wafer, the wafer may be divided into sections after the oxide superconductor thin film is deposited. The wafer on which an oxide superconductor thin film is deposited is usually divided by using a diamond cutter, not using a dicing saw. Since dicing saw cuts the wafer with lubrication with water or oil, the oxide superconductor thin film becomes contaminated and degraded.

An MgO single crystal wafer can be easily cut and divide into sections by a diamond cutter. However, owing to crystallographic characteristics of $SrTiO_3$, it is difficult to cut a $SrTiO_3$ single crystal wafer by a diamond cutter. If an attempt is made to cut a $SrTiO_3$ single crystal wafer by a diamond cutter, the wafer breaks in pieces. Therefore, in the prior art, it is difficult to divide an oxide superconductor thin film into desired sections, if it is deposited on a $SrTiO_3$ single crystal wafer. In particular, if fine superconducting devices are prepared on a $SrTiO_3$ single crystal wafer, it is almost impossible to cut the $SrTiO_3$ single crystal wafer without damaging the fine superconducting devices.

SUMMARY OF THE INVENTION

Accordingly, it is an object of the present invention to provide a method for cutting a hard to cut wafer, which overcomes the above mentioned drawbacks of the conventional ones.

Another object of the present invention is to provide a method for cutting a hard to cut wafer, on which an oxide superconductor thin film is formed, which overcomes the above mentioned drawbacks of the conventional ones.

The above and other objects of the present invention are achieved in accordance with the present invention by a method for cutting a hard to cut wafer into sections comprising steps of scribing the wafer so as to form a groove along a cutting line, drilling bores on the grooves at proper intervals and breaking the wafer along the groove.

Preferably, the bores are drilled so as to have a depth equal to 10 to 60% of the thickness of the wafer. If the bore is too shallow, it is difficult to cut the wafer into the required sections. If the bore is too deep or penetrates the wafer, the wafer may break.

In addition, the bores have a diameter of 1 mm and are drilled at intervals 3 to 4 mm. If the diameter of the bore is small, a margin to cut can be reduced. However, it is difficult to drill a bore having a small diameter and it is necessary to drill more bores.

According to another aspect of the present invention, there is provided a method for cutting a hard to cut wafer into sections comprising steps of scribing the wafer so as to form a groove along a cutting line, locally heating a portion of the wafer near the groove and breaking the wafer along the groove.

In this method, the groove is preferably scribed so as to have a depth equal to 10 to 60% of the thickness of the wafer. If the groove is too shallow, it is difficult to cut the wafer into the required sections. If the groove is too deep, the wafer may break.

In one preferred embodiment, the wafer is a $SrTiO_3$ wafer and is heated to a temperature of 800° to 1000° C. If the wafer is heated to a temperature lower than 800° C., the wafer can not be cut sharply. If the wafer is heated to a temperature higher than 1000° C., the crystalline of the wafer may be degraded. In addition, if a thin film, for example an oxide superconductor thin film, is formed on the wafer, mutual diffusion may occur between the thin film and the wafer, when the wafer is heated to a temperature higher than 1000° C.

In accordance with the present invention, the wafer is preferably heated for 30 seconds to 5 minutes. If the heating duration is shorter than 30 seconds, the wafer can not be cut sharply. However, if the heating duration is too long, the crystalline of the wafer may be degraded and mutual diffusion may occur between a thin film formed on the wafer and the wafer.

The above and other objects, features and advantages of the present invention will be apparent from the following description of preferred embodiments of the invention with reference to the accompanying drawings.

DESCRIPTION OF THE PREFERRED EMBODIMENTS

Embodiment 1

Referring to FIGS. 1A to 1E, a first embodiment of the method in accordance with the present invention for cutting a $SrTiO_3$ wafer on which an oxide superconductor thin film is deposited will be described.

Figure 1A:
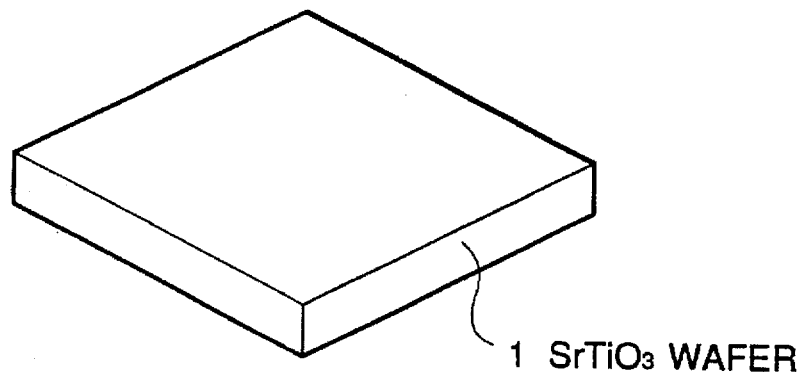
FIGS. 1A to 1E are schematic perspective views for illustrating a first embodiment of the method in accordance with the present invention for cutting a $SrTiO_3$ wafer on which an oxide superconductor thin film is deposited.
Figure 1B:
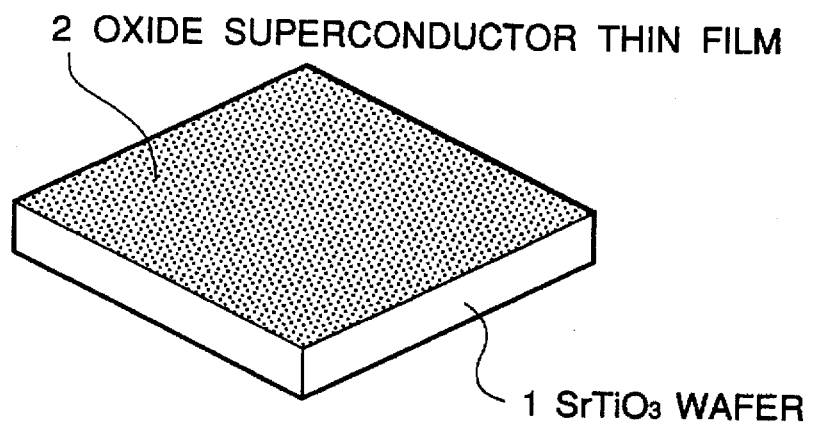

As shown in FIG. 1A, a $SrTiO_3$ (100) wafer 1 having dimensions 15 mm×15 mm and a thickness of 0.5 mm is prepared. Then, as shown in FIG. 1B, a $Y_1Ba_2Cu_3O_{7-\delta}$ oxide superconductor thin film 2 having a thickness of 200 nanometers is formed on the (100) surface of the $SrTiO_3$ wafer 1 by a MBE (Molecular Beam Epitaxy). A condition of forming the $Y_1Ba_2Cu_3O_{7-\delta}$ oxide superconductor thin film 2 by an MBE is as follows:

| Molecular beam source and its crucible temperature | Y: 1250° C. |
|---|---|
| | Ba: 600° C. |
| | Cu: 1040° C. |
| Wafer temperature | 700° C. |
| Pressure | $1 \times 10^{-5}$ Torr |

Figure 1C:
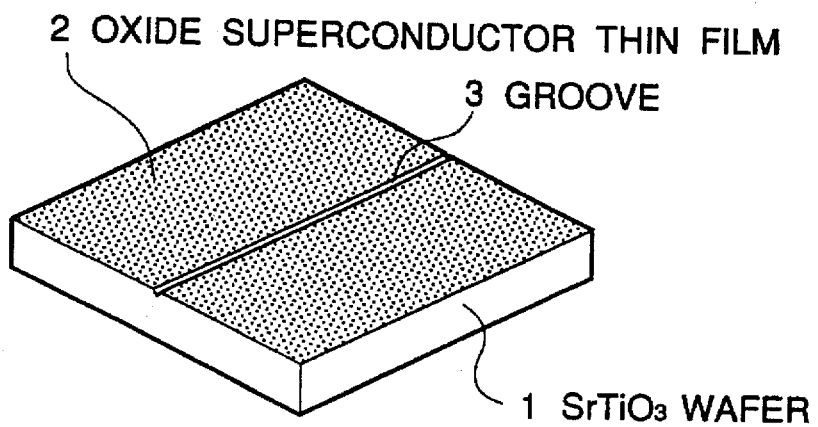
Figure 1D:
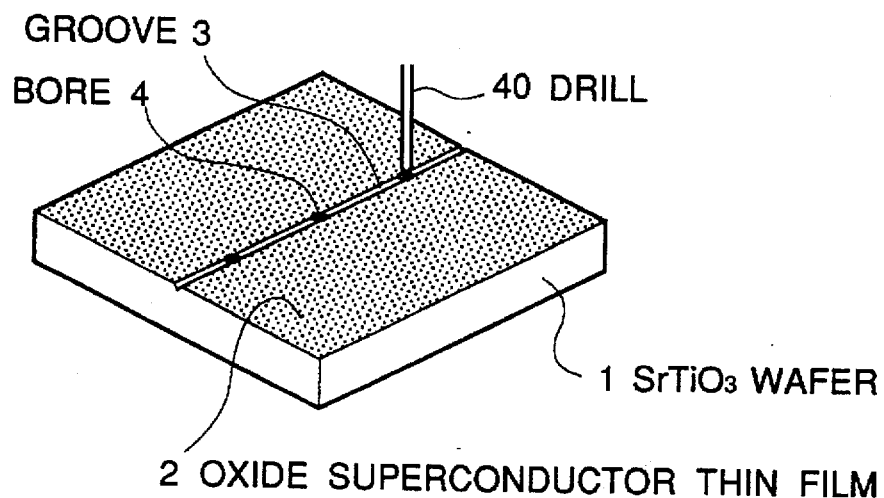

Thereafter, as shown in FIG. 1C, the $Y_1Ba_2Cu_3O_{7-\delta}$ oxide superconductor thin film 2 and the $SrTiO_3$ wafer 1 is scribed by using a diamond cutter so as to form a groove 3 across the $SrTiO_3$ wafer 1 having the maximum width of 0.35 mm and a depth of 0.1 mm. Then, as shown in FIG. 1D, bores 4 having a diameter of 1 mm and a thickness of 0.25 mm are drilled in the $SrTiO_3$ wafer 1 at intervals of 3 to 4 mm on the groove 3 by using a diamond drill 40.

As mentioned above, the bores preferably have a diameter of on the order of 1 mm and are drilled at intervals 3 to 4 mm. If the diameter of the bore is small, a margin to cut can be reduced. However, it is difficult to drill a bore having a small diameter and it is necessary to drill more bores. The depth of the bore is preferably 10 to 60% of the thickness of the wafer. If the bore is too shallow, it is difficult to cut the wafer into the required sections. If the bore is too deep or penetrates the wafer, the wafer may break.

Figure 1E:
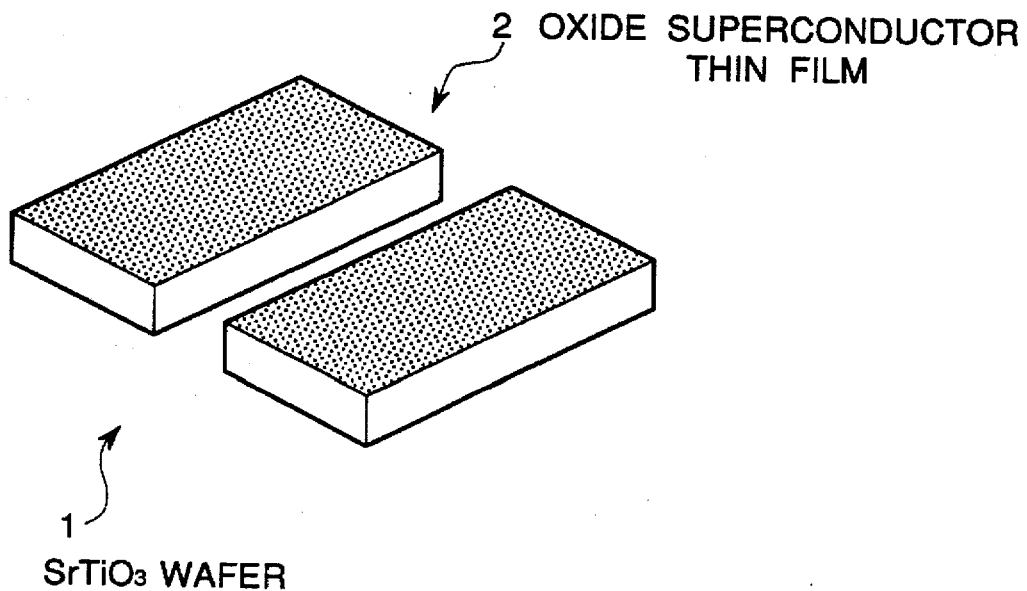

Finally, one side of the $SrTiO_3$ wafer 1 with respect to the groove 3 is held by a clamp and broken into two pieces along the groove 3, as shown in FIG. 1E. After the $SrTiO_3$ wafer 1 is cut into two pieces, the superconducting characteristics of the $Y_1Ba_2Cu_3O_{7-\delta}$ oxide superconductor thin film 2 are not affected.

As explained above, if a $SrTiO_3$ wafer on which an oxide superconductor thin film is deposited is cut into sections in accordance with the embodiment of the method of the present invention, the $SrTiO_3$ wafer can be easily divided into desired sections. In addition, individual sections of the oxide superconductor thin film are not degraded and the superconducting characteristics are not affected. Therefore, it becomes possible to prepare a lot of oxide superconductor thin films formed by the same conditions and have the same characteristics so that study of oxide superconductors can be advanced efficiently.

Embodiment 2

Figure 2A:
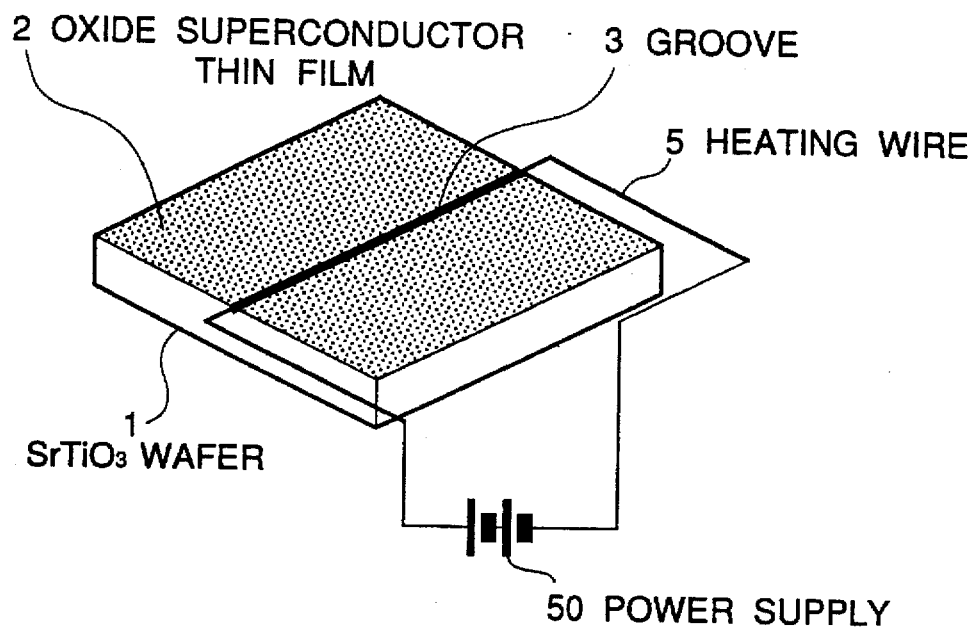
FIGS. 2A and 2B are schematic perspective views for illustrating featured steps of a second embodiment of the method in accordance with the present invention for cutting a $SrTiO_3$ wafer on which an oxide superconductor thin film is deposited.
Figure 2B:
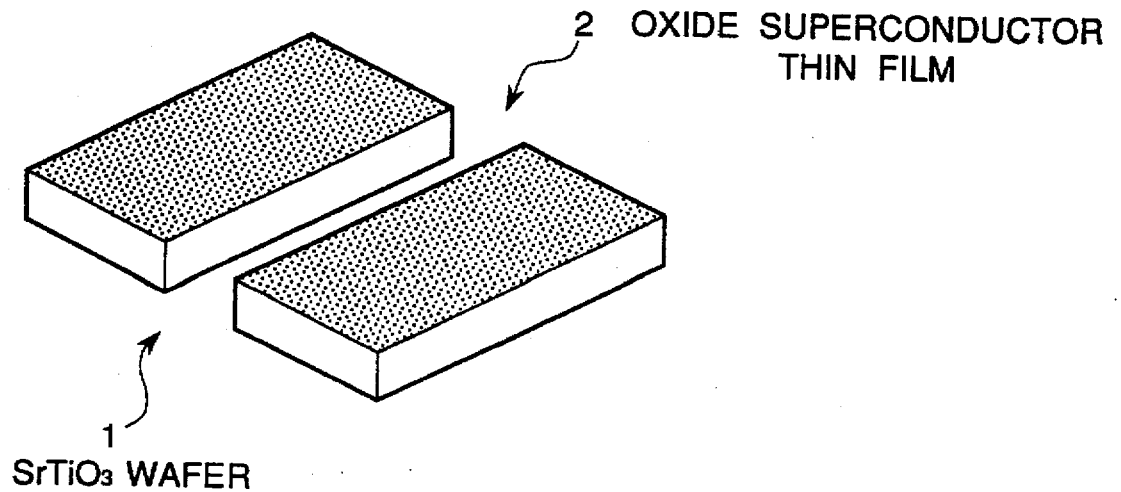

Referring to FIGS. 2A and 2B, a second embodiment of the method in accordance with the present invention for cutting a $SrTiO_3$ wafer on which an oxide superconductor thin film is deposited will be described.

In this second embodiment, the same processings as those shown in FIGS. 1A to 1C are performed. After the groove 3 are scribed on the $SrTiO_3$ wafer 1, a heating wire 5 of Pt having a diameter of 0.3 mm is inserted into groove 3, as shown in FIG. 2A.

The depth of the groove is preferably 10 to 60% of the thickness of the wafer. If the groove is too shallow, it is difficult to cut the wafer into the required sections. If the groove is too deep, the wafer may break.

Then, direct current is supplied to the heating wire 5 by a power supply 50 so that a portion of the $SrTiO_3$ wafer 1 near the groove 3 is locally heated to a temperature of 1000° C. for four minutes.

The temperature to which the wafer is heated is preferably 800° to 1000° C. and the duration of the heating is preferably 30 seconds to 5 minutes. For this purpose, the heating wire is preferably formed of a hard to oxidize material, such as Pt, Pt-Rh alloy.

After the $SrTiO_3$ wafer 1 is cooled to the room temperature, one side of the $SrTiO_3$ wafer 1 with respect to the groove 3 is held by a clamp and broken into two pieces along the groove 3, as shown in FIG. 2B. The superconducting characteristics of the $Y_1Ba_2Cu_3O_{7-\delta}$ oxide superconductor thin film 2 are not affected, even after the $SrTiO_3$ wafer 1 is cut into two pieces.

As explained above, if a $SrTiO_3$ wafer on which an oxide superconductor thin film is deposited is cut into sections in accordance with the second embodiment of the method of the present invention, the $SrTiO_3$ wafer can be easily divided into desired sections. In addition, individual sections of the oxide superconductor thin film are not degraded and the superconducting characteristics are not affected. Therefore, it becomes possible to prepare a lot of oxide superconductor thin films formed by the same conditions and have the same characteristics so that study of oxide superconductors can be advanced efficiently.

Embodiment 3

Figure 3A:
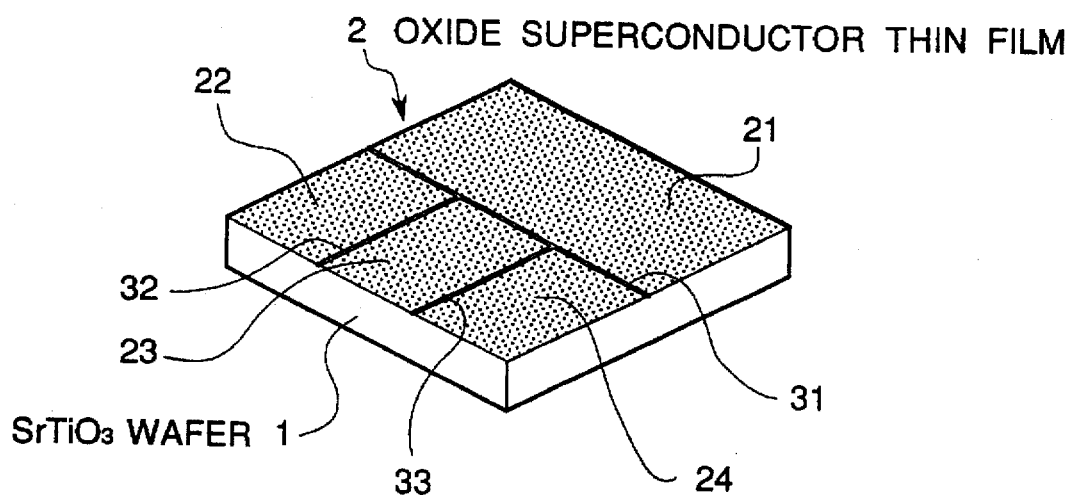
FIG. 3A is a schematic view of a $SrTiO_3$ wafer on which an oxide superconductor thin film is deposited, which will be cut by the method in accordance with the present invention.

Referring to FIG. 3A, a third embodiment of the method in accordance with the present invention for cutting a $SrTiO_3$ wafer on which an oxide superconductor thin film is deposited will be described.

In this third embodiment, a $SrTiO_3$ wafer 1 having dimensions 15 mm×15 mm and a thickness of 0.5 mm, on which a $Y_1Ba_2Cu_3O_{7-\delta}$ oxide superconductor thin film 2 is deposited is cut along cutting lines 31 to 33 into sections 21 to 24 by the same method as the Embodiment 1.

At first, the $Y_1Ba_2Cu_3O_{78}$ oxide superconductor thin film 2 having a thickness of 200 nanometers is formed under the same condition as the Embodiment 1. Then, the $Y_1Ba_2Cu_3O_{7-\delta}$ oxide superconductor thin film 2 and the $SrTiO_3$ wafer 1 are scribed by using a diamond cutter so as to form grooves 31 to 33 similar to the groove 3 of the Embodiment 1.

Thereafter, bores having a diameter of 1 mm and a thickness of 0.25 mm are drilled in the $SrTiO_3$ wafer 1 at intervals of 3 to 4 mm on the grooves 31 to 33 by using a diamond drill.

Finally, one side of the $SrTiO_3$ wafer 1 with respect to one of the grooves 31 to 33 is held by a clamp and broken into two pieces along the groove, and this process is repeated three times so that the $SrTiO_3$ wafer 1 is divided into sections 21 to 24.

The $Y_1Ba_2Cu_3O_{7-\delta}$ oxide superconductor thin films of the sections 21 to 24 were evaluated by XPS (X-ray photoelectron spectroscopy), measuring the critical temperature and the critical current density, ICP (inductively coupled plasma) and SEM (scanning electron microscope). It became clear that the oxide superconductor thin films were in good condition.

Embodiment 4

Referring to FIG. 3A again, a fourth embodiment of the method in accordance with the present invention for cutting a SrTiO₃ wafer on which an oxide superconductor thin film is deposited will be described.

In this forth embodiment, a SrTiO₃ wafer 1 having dimensions 15 mm×15 mm and a thickness of 1 mm, on which a $Y_1Ba_2Cu_3O_{7-\delta}$ oxide superconductor thin film 2 is deposited is cut along cutting lines 31 to 33 into sections 21 to 24 by the same method as the Embodiment 2.

At first, the $Y_1Ba_2Cu_3O_{7-\delta}$ oxide superconductor thin film 2 having a thickness of 200 nanometers is formed under the same condition as the Embodiment 1. Then, the $Y_1Ba_2Cu_3O_{7-\delta}$ oxide superconductor thin film 2 and the SrTiO₃ wafer 1 is scribed by using a diamond cutter so as to form grooves 31 to 33 having a depth of 0.3 mm.

Thereafter, heating wires similar to the heating wire 5 of the Embodiment 2 are inserted into grooves 31 to 33. Then, direct current is supplied to the heating wires so that portions of the SrTiO₃ wafer 1 near the grooves 31 to 33 are locally heated to a temperature of 900° C. for five minutes.

After the SrTiO₃ wafer 1 is cooled to the room temperature, one side of the SrTiO₃ wafer 1 with respect to one of the grooves 31 to 33 is held by a clamp and broken into two pieces along the groove, and this process is repeated three times so that the SrTiO₃ wafer 1 is divided into sections 21 to 24.

The $Y_1Ba_2Cu_3O_{7-\delta}$ oxide superconductor thin films of the sections 21 to 24 were evaluated by XPS, measuring the critical temperature and the critical current density, ICP and SEM. It became clear that the oxide superconductor thin films were in good condition.

Embodiment 5

Figure 3B:
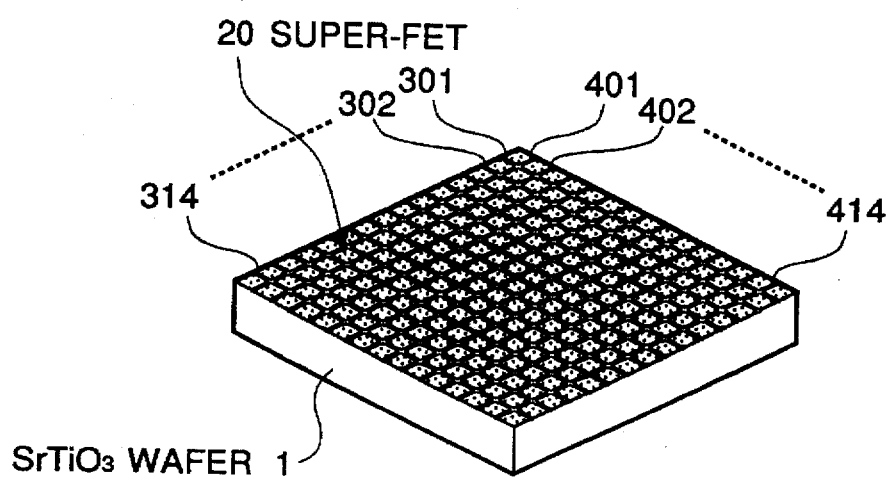
FIG. 3B is a schematic view of a $SrTiO_3$ wafer on which superconducting field effect devices are prepared, which will be divided into individual devices by the method in accordance with the present invention.

Referring to FIG. 3B, a fifth embodiment of the method in accordance with the present invention for cutting a SrTiO₃ wafer on which a lot of superconducting field effect devices (abbreviated as super-FET hereinafter) utilizing a $Y_1Ba_2Cu_3O_{7-\delta}$ oxide superconductor thin film are formed will be described.

In this fifth embodiment, a SrTiO₃ wafer 1 having dimensions 15 mm×15 mm and a thickness of 0.7 mm, on one surface 20 of which a lot of super-FETs utilizing a $Y_1Ba_2Cu_3O_{7-\delta}$ oxide superconductor thin film are formed is cut along cutting lines 301 to 314 and 401 to 414 into individual superconducting field effect devices by the same method as the Embodiment 1.

At first, a lot of super-FETs are manufactured on the surface 20 of the SrTiO₃ wafer 1. The structure of the super-FET and the process for manufacturing the super-FET are disclosed in U.S. Pat. No. 5,236,896 issued to NAKAMURA et al.

Then, the surface 20 of the SrTiO₃ wafer 1 is scribed by using a diamond cutter so as to form grooves 301 to 314 and 401 to 414 similar to the groove 3 of the Embodiment 1.

Thereafter, bores having a diameter of 1 mm and a thickness of 0.35 mm are drilled in the SrTiO₃ wafer 1 at intervals of 3 to 4 mm on the grooves 301 to 314 and 401 to 414 by using a diamond drill.

Finally, one side of the SrTiO₃ wafer 1 with respect to one of the grooves 301 to 314 and 401 to 414 is held by a clamp and broken into two pieces along the groove, and this process is repeated so that the super-FET are divided into individual devices.

Each of the divided super-FETs was evaluated, so that it became clear that it was in good condition and its properties were not spoiled.

Embodiment 6

Referring to FIG. 3B again, a sixth embodiment of the method in accordance with the present invention for cutting a SrTiO₃ wafer on which a lot of super-FET utilizing a $Y_1Ba_2Cu_3O_{7-\delta}$ oxide superconductor thin film are formed will be described.

In this sixth embodiment, a SrTiO₃ wafer 1 having dimensions 15 mm×15 mm and a thickness of 0.7 mm, on one surface 20 of which a lot of super-FETs utilizing a $Y_1Ba_2Cu_3O_{7-\delta}$ oxide superconductor thin film are formed is cut along cutting lines 301 to 314 and 401 to 414 into individual superconducting field effect devices by the same method as the Embodiment 2.

The surface 20 of the SrTiO₃ wafer 1, on which a lot of super-FET are manufactured similarly to that of the Embodiment 5 is scribed by using a diamond cutter so as to form grooves 301 to 314 and 401 to 414 having a thickness of on the order of 0.35 mm.

Thereafter, heating wires similar to the heating wire 5 of the Embodiment 2 are inserted into grooves 301 to 314 and 401 to 414. Then, direct current is supplied to the heating wires so that portions of the SrTiO₃ wafer 1 near the grooves 301 to 314 and 401 to 414 are locally heated to a temperature of 800° C. for four minutes.

After the SrTiO₃ wafer 1 is cooled to the room temperature, one side of the SrTiO₃ wafer 1 with respect to one of the grooves 301 to 314 and 401 to 414 is hold by a clamp and broken into two pieces along the groove, and this process is repeated so that the super-FET are divided into individual devices.

Each of the divided super-FETs was evaluated, so that it became clear that it was in good condition and its properties were not spoiled.

In the above mentioned embodiments, the oxide superconductor thin film can be formed of not only the Y-Ba-Cu-O compound oxide superconductor material, but also a high-$T_c$ (high critical temperature) oxide superconductor material, particularly a high-$T_c$ copper-oxide type compound oxide superconductor material, for example a Bi-Sr-Ca-Cu-O compound oxide superconductor material, and a Tl-Ba-Ca-Cu-O compound oxide superconductor material.

In addition, the present invention can be applied to cutting not only SrTiO₃ but also a wafer hard to cut wafer that can not be cloven, an such as amorphous wafer, etc.

The invention has thus been shown and described with reference to the specific embodiments. However, it should be noted that the present invention is in no way limited to the details of the illustrated structures but converts and modifications may be made within the scope of the appended claims.

What is claimed is:

1. A method of manufacturing a plurality of sections from a single-crystal wafer comprising the steps of:

depositing an oxide superconductor film onto the wafer;

scribing the oxide superconductor film and wafer to form a groove having a depth parallel to a crystal orientation of the wafer having low Miller indices therein;

heating the wafer near the groove;

cooling the wafer to room temperature; and breaking the wafer along the groove, wherein the groove has a depth of between 10% and 60% of the thickness of the wafer, and the wafer is heated to a temperature of between 800° and 1000° C. for a time of between 30 seconds and 5 minutes during the heating step.

2. A method of claim 1, wherein the oxide superconductor film is $Y_1Ba_2Cu_3O_{7-\delta}$.

3. A method of claim 1, wherein the oxide superconductor film has a thickness of approximately 200 nanometers.

4. A method of claim 1, wherein the oxide superconductor film is formed on the wafer by molecular beam epitaxy.

5. A method of claim 1, wherein the wafer is $SrTiO_3$.

6. A method of breaking a single-crystal wafer into sections, comprising the steps of:

scribing the wafer so as to form a groove having a depth parallel to a crystal orientation of the wafer having low Miller indices along a breaking line;

locally heating the wafer along the groove to a temperature of between 800° to 1000° C. for a time of between 30 seconds and 5 minutes;

cooling the wafer to room temperature; and breaking the wafer along the groove.

7. A method as claimed in claim 6, wherein the groove has a depth equal to 10 to 60% of the thickness of the wafer.

8. A method as claimed in claim 6, wherein the wafer has a thickness no greater than 1 mm.

9. A method as claimed in claim 6, wherein the groove is heated by a heating wire.

10. A method as claimed in claim 9, wherein the heating wire is heated by passing a current therethrough.

11. A method as claimed in claim 6, wherein the wafer has a length and a width of between 10 and 100 mm.

12. A method as claimed in claim 6, wherein the wafer is a $SrTiO_3$ wafer.

13. A method as claimed in claim 6, wherein the heating step comprises positioning a heating wire along the entire groove and passing a current therethrough.

14. A method of manufacturing a plurality of sections from a single-crystal wafer comprising the steps of:

depositing an oxide superconductor film onto the wafer;

scribing the oxide superconductor film and wafer to form a groove having a depth parallel to a crystal orientation of the wafer having low Miller indices therein;

heating the wafer near the groove;

cooling the wafer to room temperature; and breaking the wafer along the groove, wherein the heating step comprises positioning a heating wire along the entire groove and passing a current therethrough.

* * * * *